(12) United States Patent  (10) Patent No.: US 8,931,135 B1
Sangster  (45) Date of Patent: Jan. 13, 2015

(54) VACUUM SYSTEM FOR COMPUTERS

(76) Inventor: Eujene D. Sangster, Palm Beach Gardens, FL (US)

( * ) Notice: Subject to any disclaimer, the term of this patent is extended or adjusted under 35 U.S.C. 154(b) by 772 days.

(21) Appl. No.: 13/248,516

(22) Filed: Sep. 29, 2011

(51) Int. Cl.
A47L 5/00 (2006.01)
A47L 5/38 (2006.01)
A47L 5/14 (2006.01)

(52) U.S. Cl.
CPC ..... A47L 5/14 (2013.01); A47L 5/38 (2013.01)
USPC .................................. 15/314; 15/330; 15/339

(58) Field of Classification Search
CPC ............... A47L 5/14; A47L 5/36; A47L 5/38; A47L 7/0047
USPC ........................ 15/301, 314, 330, 339; 134/21
IPC ................................................ A47L 5/00, 5/38
See application file for complete search history.

(56) References Cited

U.S. PATENT DOCUMENTS

| 4,861,178 A | 8/1989 | Reed |
| 4,989,291 A * | 2/1991 | Parent ............................. 15/315 |
| 5,535,477 A | 7/1996 | Witkowski |
| 5,559,673 A | 9/1996 | Gagnon et al. |
| 6,620,222 B2 | 9/2003 | White |
| D600,338 S | 9/2009 | Chung |
| 8,387,208 B2 * | 3/2013 | Davis ............................. 15/415.1 |
| 2002/0163789 A1 | 11/2002 | Yu-che et al. |
| 2006/0090289 A1 | 5/2006 | Kuang |
| 2007/0089862 A1 | 4/2007 | Lu et al. |
| 2008/0115473 A1 | 5/2008 | Miller |

* cited by examiner

Primary Examiner — David Redding

(57) ABSTRACT

A vacuum system having a housing with a hose end, a filter end, and an attachment end, wherein the filter end is at least partially open, having a vacuum mechanism in an inner cavity of the housing which comprises a vacuum fan in an inner channel that extends from the hose end to near a filter end, the vacuum fan is operatively connected to a motor that functions to control the vacuum fan, having a hose which is fluidly connected to the inner channel, having an attachment brace which functions to help attach the outer end of the hose to a computer system, having a filter, having an attachment means which functions to help temporarily attach the housing to a computer system, having a power button operatively connected to the motor which functions to turn the motor on and off.

12 Claims, 7 Drawing Sheets (ISO View)

(ISO View)

(ISO Back View)

(Bottom View)

(Top View)

(Back View)

(In Side View)

(ISO View- Alternative Embodiment)

(Top View- Alternative Embodiment)

(Inside View of Alternative Embodiment)

VACUUM SYSTEM FOR COMPUTERS

FIELD OF THE INVENTION

The present invention is directed to a vacuum device, more particularly to a vacuum system for computers or other pieces of equipment.

BACKGROUND OF THE INVENTION

Computers are often subjected to an atmosphere where dust flows rampant. Such dust can cause damage to the computer system. The present invention features a novel vacuum system for helping to remove dust, hair, and other harmful particles in and around computers, servers, keyboards, and the like. The present invention is not limited to use with computers. For example, the system may be used to help remove dust and dirt from behind or underneath refrigerators and single-standing freezers or removing dust and dirt from air conditioning vents and units.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

SUMMARY

The present invention features a vacuum system for computers. In some embodiments, the vacuum system comprises a housing having a hose end, a filter end, and an attachment end, the filter end is at least partially open; a vacuum mechanism disposed in an inner cavity of the housing, the vacuum mechanism comprises a vacuum fan disposed in an inner channel that extends from the hose end of the housing to near a filter end of the housing, the vacuum fan is operatively connected to a motor that functions to control the vacuum fan; a hose disposed on the hose end of the housing, the hose is fluidly connected to the inner channel in the housing, wherein an attachment brace is disposed on an outer end of the hose, the attachment brace functions to help attach the outer end of the hose to a computer system; a filter disposed in the filter end of the housing; an attachment means disposed on the attachment end of the housing, the attachment means functions to help temporarily attach the housing to a computer system; a power button operatively connected to the motor, the power button functions to turn the motor on and off; and a secondary hose extending from the outer end of the hose, the secondary hose is smaller in diameter than the hose.

In some embodiments, the hose is removably attached to a hose aperture disposed in the hose end of the housing. In some embodiments, the filter is removable. In some embodiments, the system further comprises a vent disposed in the hose end of the housing. In some embodiments, the system comprises two secondary hoses. In some embodiments, the system comprises three secondary hoses. In some embodiments, the system comprises four secondary hoses. In some embodiments, the system comprises at least four secondary hoses.

In some embodiments, the motor is operatively connected to a power source. In some embodiments, the power source is stored in a battery compartment disposed in the housing. In some embodiments, the system further comprises control buttons functioning to control a speed of the motor. In some embodiments, the attachment means is a magnet.

DESCRIPTION OF PREFERRED EMBODIMENTS

Figure 4:
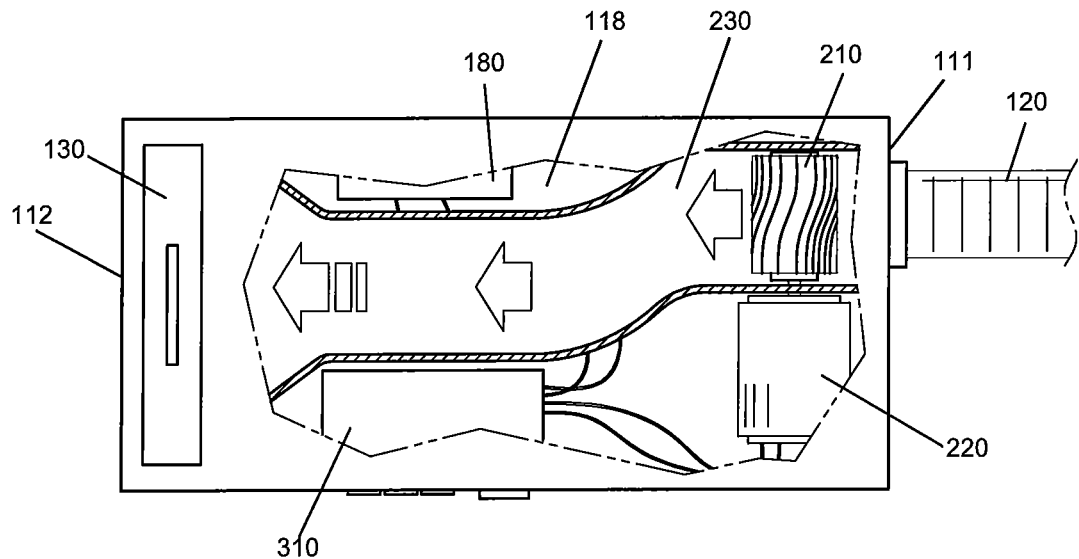
FIG. 4 is a top view of the system of the present invention.
Figure 5:
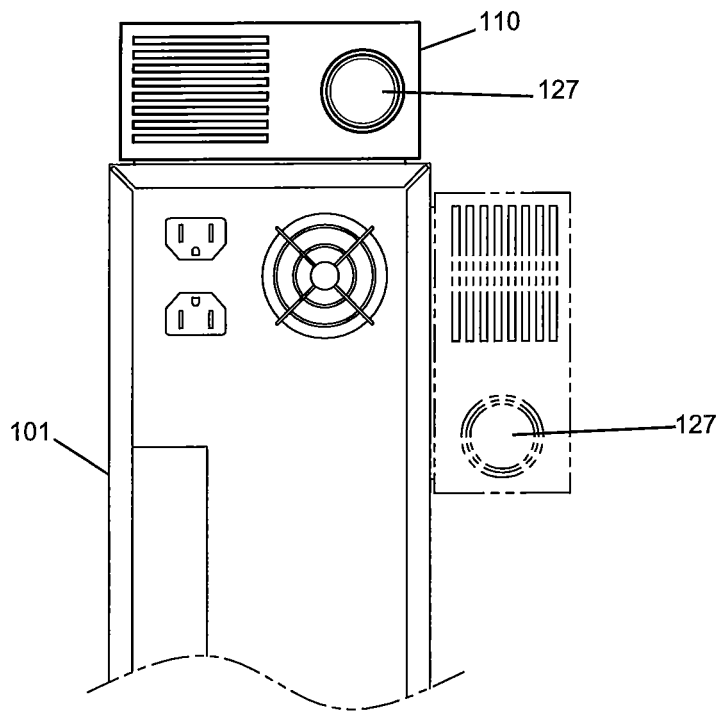
FIG. 5 is an in-use view of the system of the present invention.

Referring now to FIG. 1-9, the present invention features a novel vacuum system 100 for computer systems 101 and other equipment such as refrigerators and freezers. The system 100 comprises a housing 110 having an inner cavity 118. Disposed in the inner cavity is a vacuum mechanism. Vacuum mechanisms are well known to one of ordinary skill in the art. For example, as shown in FIG. 4, the vacuum mechanism comprises a vacuum fan 210 operatively connected to a motor 220. The vacuum fan 210 is disposed in an inner channel 230 that runs from the hose end 111 of the housing 110 to (at or near) the filter end 112 of the housing 110. The motor 220 functions to control the vacuum fan 210.

Disposed on the hose end 111 (e.g., a first end) of the housing 110 is a hose 120. The hose 120 resembles standard vacuum hoses, which are well known to one of ordinary skill in the art. In some embodiments, the hose 120 is removably attached to the housing 110 (e.g., see FIG. 3). For example, the hose 120 may attach to a hose aperture 127 disposed in the hose end 111 of the housing 110 (e.g., see FIG. 5, which shows two housings 110 without the hoses 120 attached).

The hose 120 is fluidly connected to the vacuum mechanism, for example the hose 120 is fluidly connected to the inner channel 230. The hose 120 functions to help draw in the dust and dirt into the vacuum mechanism. The hose 120 can be placed in and/or around critical areas of the computer system 101, e.g., areas where dust and dirt tends to accumulate (e.g., the central processing unit (CPU) heat sink, computer fans 106, the hard drive, the motherboard 104, the inside bottom of the computer case, etc.). In some embodiments, a vent 128 is disposed in the hose end 111 of the housing 110.

Figure 1:
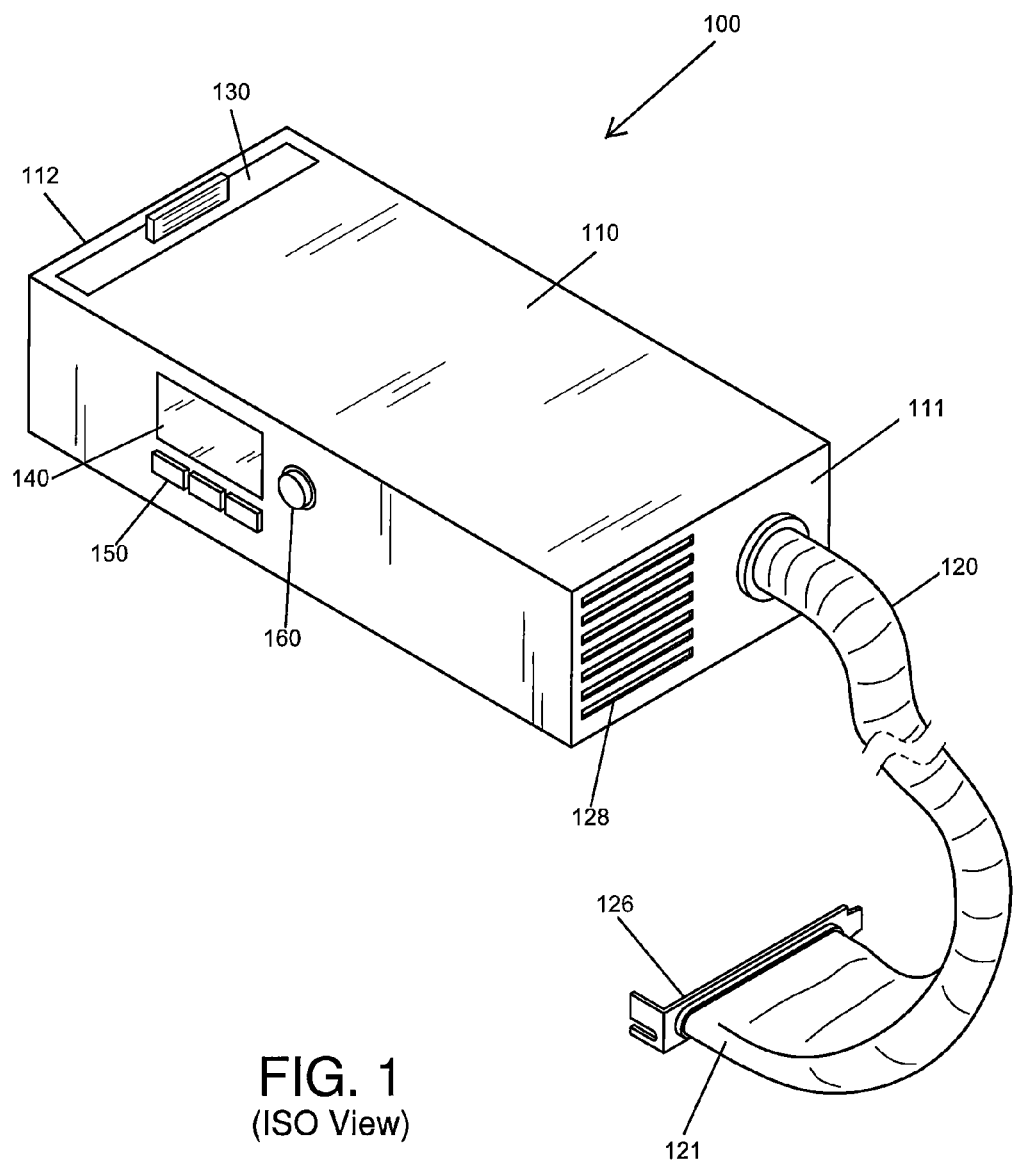
FIG. 1 is a front perspective view of the system of the present invention.

Disposed on the outer end 121 of the hose 120 is an attachment brace 126 (e.g., see FIG. 1). The attachment brace 126 functions to help attach the outer end 121 of the hose 120 to the computer system 101. For example, in some embodiments, the attachment brace 126 attaches inside the computer system 101. The attachment brace 126 helps stabilize the hose 120 and keep the hose 120 secured to the computer system 101.

Figure 2:
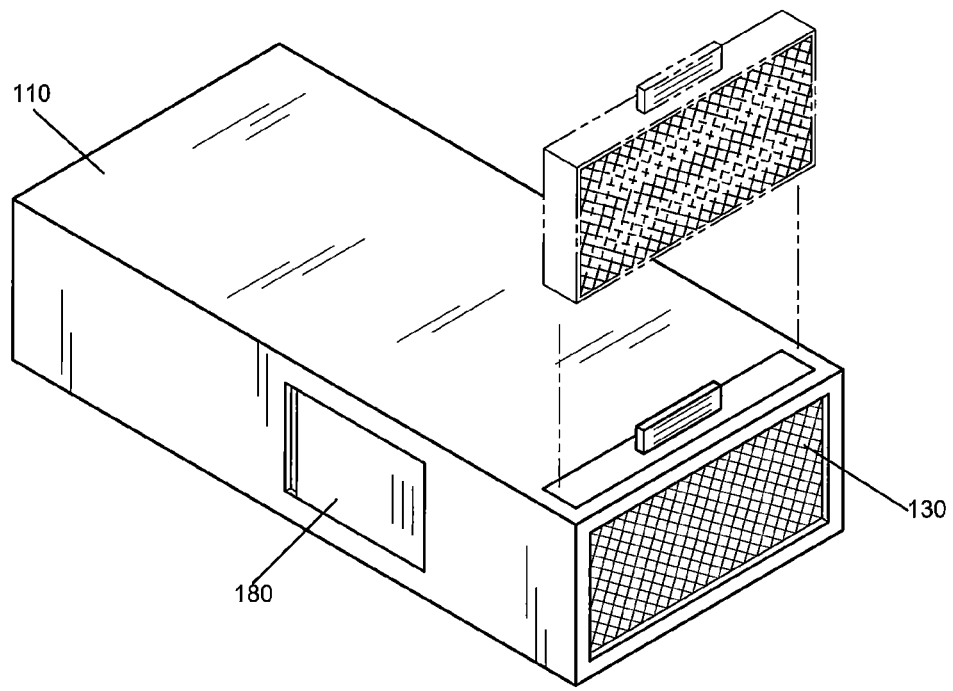
FIG. 2 is a back perspective view of the system of the present invention.
Figure 3:
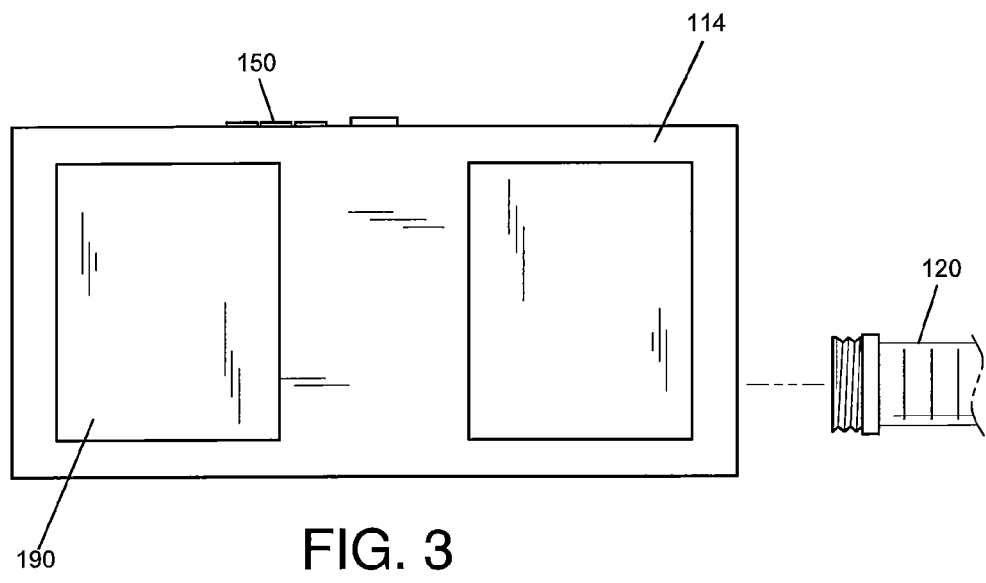
FIG. 3 is a bottom view of the system of the present invention.

A filter 130 is disposed in the filter end 112 (e.g., second end) of the housing 110. In some embodiments, the filter 130 is removable (e.g., see FIG. 2 showing the filter 130 removed from the filter end 112 of the housing 110). The filter end 112 of the housing 110 may be partially or completely open (e.g., allowing air to be exhausted from the inner cavity 118 of the housing 110).

Disposed on the attachment end 114 (e.g., bottom surface) of the housing 110 is an attachment means 190. The attachment means 190 functions to help temporarily attach the housing 110 to a computer system 101 (e.g., see FIG. 5). In some embodiments, two or more attachment means 190 are disposed on the housing 110. The attachment means 190 may include but is not limited to a magnet, a suction cup, a hook-and-loop fastener mechanism, the like, or a combination thereof.

The system 100 of the present invention further comprises a display 140.

The system 100 of the present invention further comprises control buttons 150 and a power button 160. The control buttons 150 and the power button 160 are each operatively connected to the motor 220. The power button 160 functions to turn the motor 220 on and off. The control buttons 150 function to control the speed of the motor 220 (e.g., vacuum suction). Control buttons and power buttons are well known to one of ordinary skill in the art. The control buttons 150 and/or power button 160 may be operatively connected to a microprocessor disposed in a control box 310 disposed in the housing 110.

The motor 220 and/or the display 140 and/or other components of the system are operatively connected to a power source, for example a battery. The battery may be stored in a battery compartment 180 disposed in the housing 110 (e.g., see FIG. 2, FIG. 4).

Figure 6:
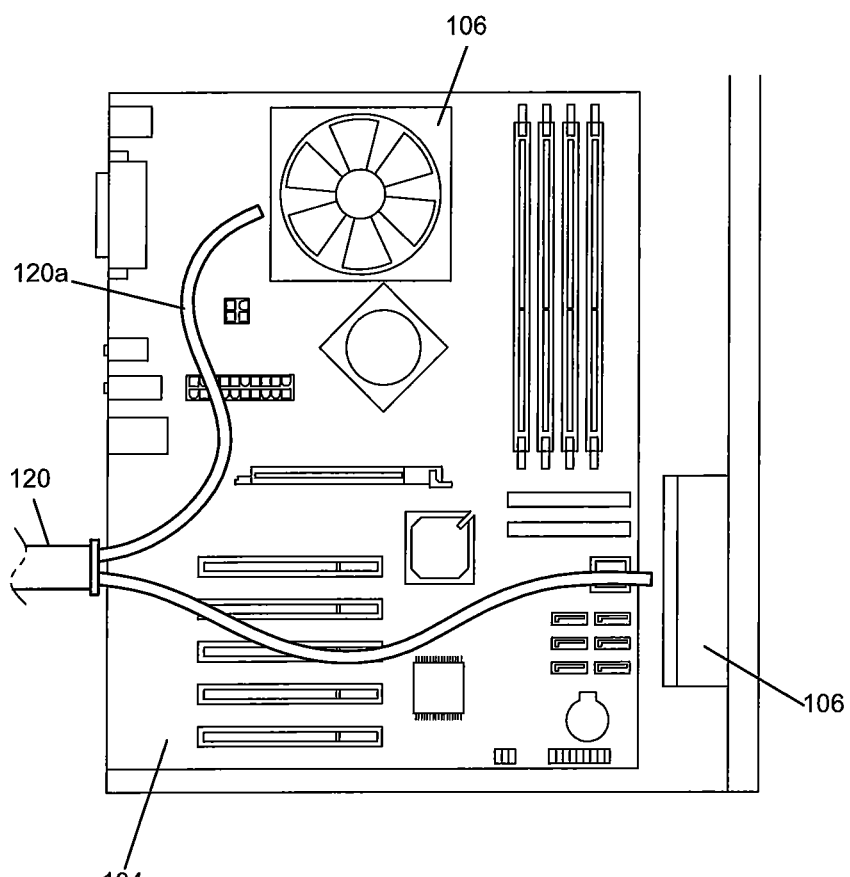
FIG. 6 is an in-use view of the system of the present invention.

As shown in FIG. 6, in some embodiments, a secondary hose 120a extends from the hose 120 (e.g., the outer end 121 of the hose 120). The secondary hose 120a is smaller (e.g., in diameter) than the hose 120. The secondary hose 120a can be fed into the computer system to more directly access the dirt and dust. In some embodiments, the system 100 comprises one secondary hose 120a. In some embodiments, the system 100 comprises two secondary hoses 120a. In some embodiments, the system 100 comprises three secondary hoses 120a. In some embodiments, the system 100 comprises four secondary hoses 120a. In some embodiments, the system 100 comprises at least four secondary hoses 120a.

In some embodiments, the system 100 comprises an indicator light. The indicator light may be illuminated with the filter 130 is full, for example.

In some embodiments, uses can control the vacuum suction speed. In some embodiments, users can set the system 100 to automatically clean (e.g., with the help of a dust sensor). In some embodiments, users can continually keep the device on or turn it off as they see fit (e.g., via the power button). In some embodiments, the system 100 comprises anti-static grounded bars.

In some embodiments, the system 100 of the present invention can be used for keyboards. For example, the system 100 may comprise an auxiliary tube that can be attached to the housing 110, wherein the auxiliary tube can be use for removing duct particles and other unwanted debris from keyboards.

In some embodiments, the system 100 comprises a vacuum mechanism and an air compressor. The air compressor may have tubes attached to it for placement in the critical areas of the computer system 101 as described above. The air compressor functions to blow the dust off the critical areas and the vacuum mechanism functions to vacuum the dust. In some embodiments, the system 100 comprises a sensor for detecting duct particulars, causing automatic activation of the system 100. In some embodiments, the power switch is used for manual operation of the system 100.

The system 100 of the present invention may be constructed in a variety of sizes, styles, and designs.

As used herein, the term "about" refers to plus or minus 10% of the referenced number. For example, an embodiment wherein the device is about 10 inches in length includes a device that is between 9 and 11 inches in length.

Figure 7:
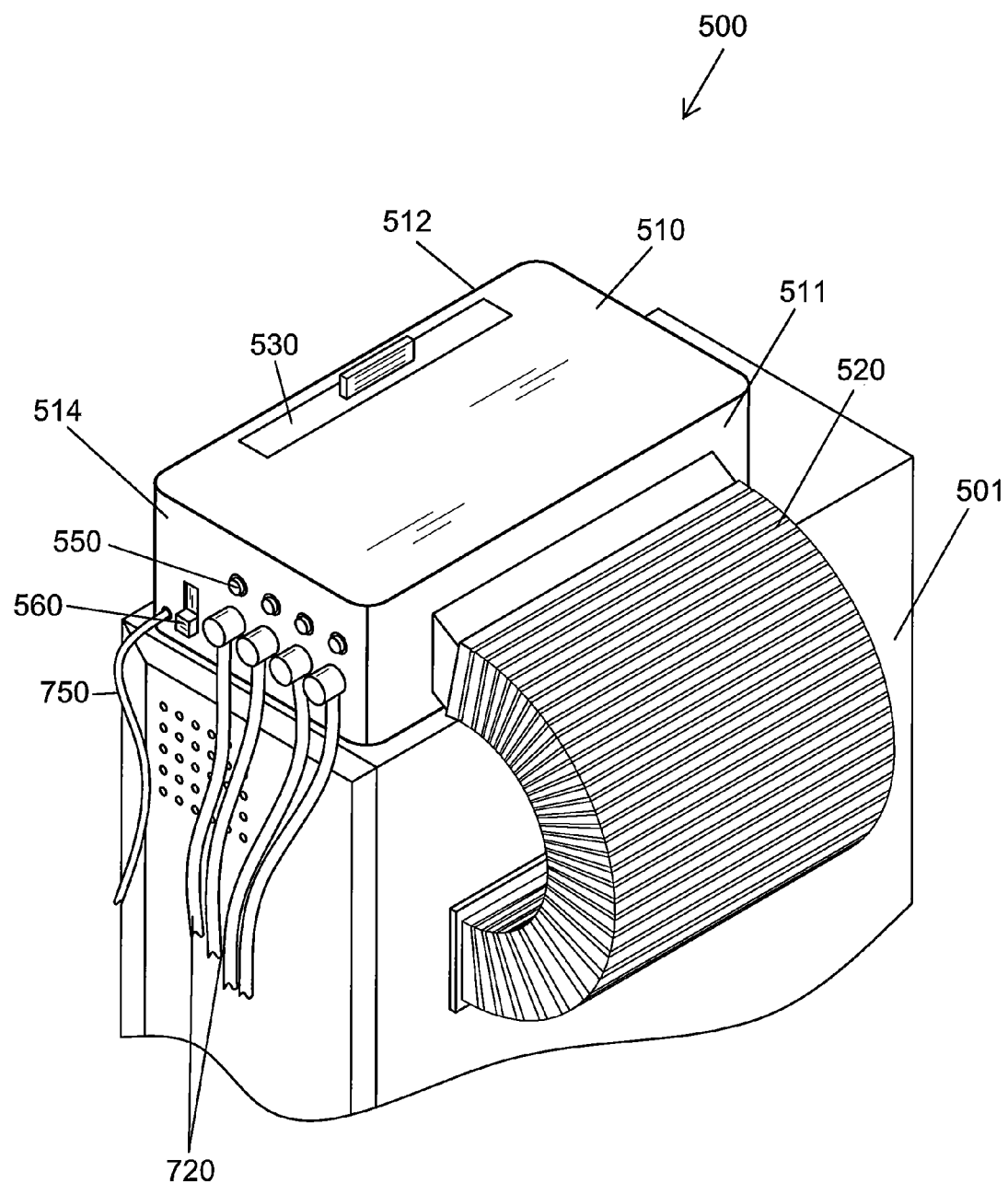
FIG. 7 is a perspective view of an alternative embodiment of the system of the present invention.
Figure 8:
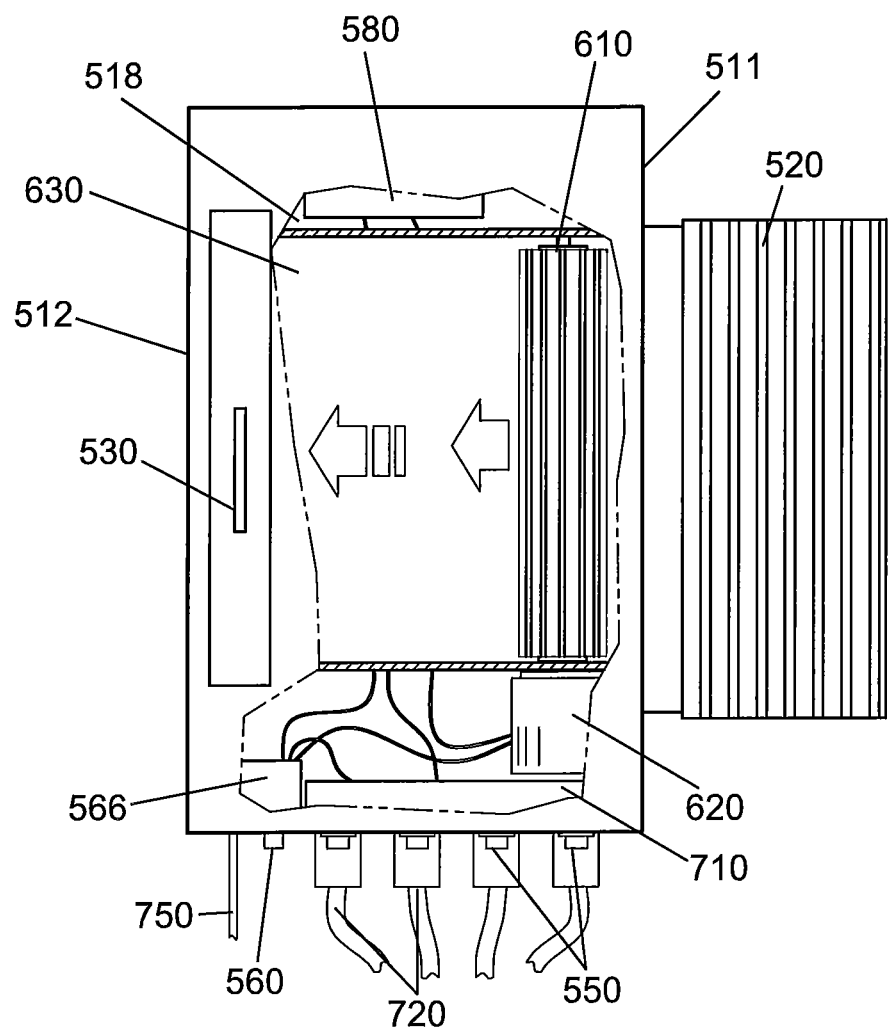
FIG. 8 is a top and internal view of the embodiment of FIG. 7.
Figure 9:
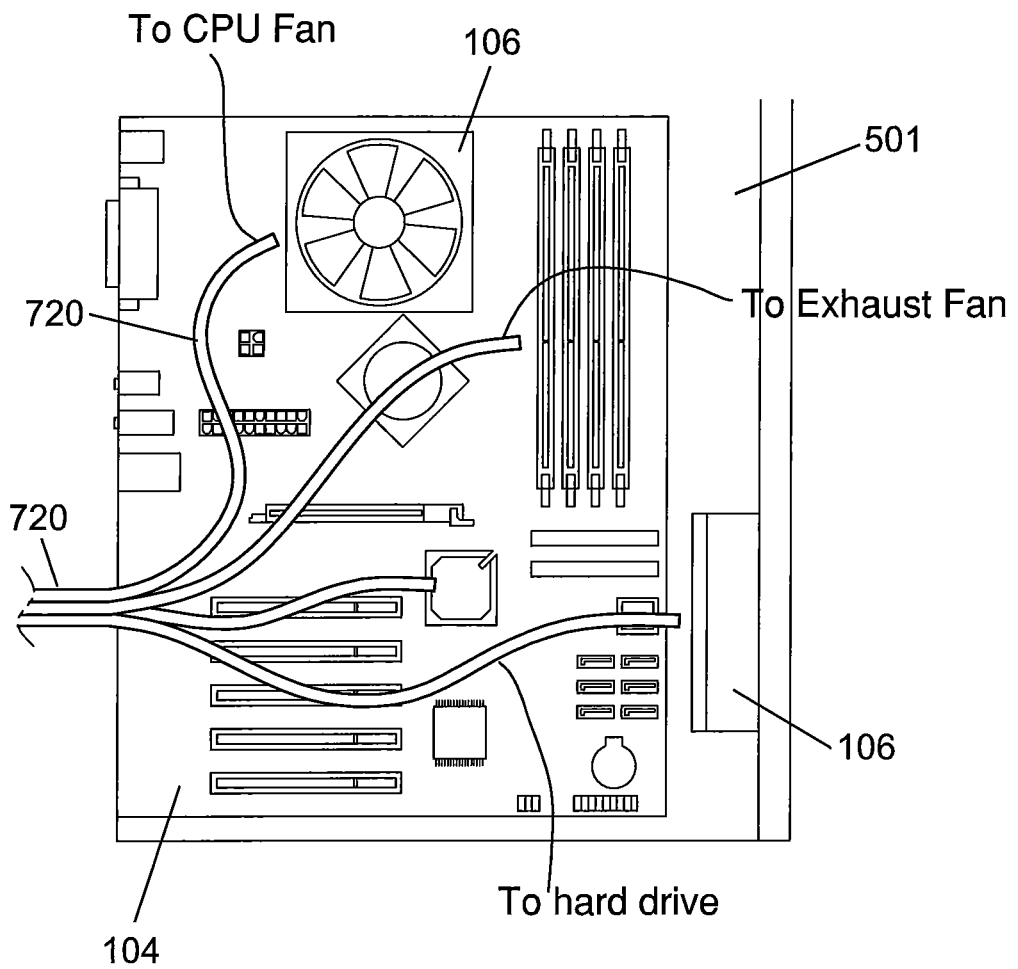
FIG. 9 is a side and internal view of the system of the present invention (e.g., the embodiment of FIG. 7).

Referring now to FIG. 7-9, the present invention also features a vacuum system 500 comprising a housing 510 having a hose end 511, a filter end 512, and an attachment end 514. A hose 520 (vacuum hose) is disposed on the hose end 511 of the housing 510. As shown in FIG. 7, the hose 520 connects to the computer 501 (e.g., the side of the computer).

A filter 530 is disposed in the filter end 512 of the housing 510. In some embodiments, the filter 530 is removable. The filter end 512 of the housing 510 may be partially or completely open (e.g., allowing air to be exhausted from the inner cavity 518 of the housing 510).

A vacuum mechanism is disposed in the inner cavity 518 of the housing 510. The vacuum mechanism comprises a vacuum fan 610 disposed in an inner channel 630 that extends from the hose end 511 of the housing 510 to near the filter end 512 of the housing 110. The vacuum fan 610 is operatively connected to a motor 620 that functions to control the vacuum fan 610. The hose 520 is fluidly connected to the vacuum mechanism, for example the hose 520 is fluidly connected to the inner channel 630. The hose 520 functions to help draw in the dust and dirt into the vacuum mechanism. In some embodiments, a vent is disposed in the hose end 511 of the housing 510.

The system 500 further comprises an air compressor 710 disposed in the housing 510. Air compressors are well known to one of ordinary skill in the art. One or more air compressor hoses 720 are operatively (fluidly) connected to the air compressor 710 and extend from the attachment end 514 of the housing 510. The air compressor hoses 720 can be placed next to the critical areas of the computer 501 (e.g., see FIG. 9). The air compressor 710 functions to blow dust and debris off of the critical areas, while the vacuum mechanism functions to vacuum the dust and debris.

The system 500 further comprises a power button 560 (e.g., on/off switch). Power buttons are well known to one of ordinary skill in the art. The power button 560 is operatively connected to the motor 650 and the air compressor 710 (e.g., via a control box 566, wires, etc.). The power button 560 functions to turn on and off the motor 650 and air compressor 710.

The system 100 of the present invention further comprises a control button 550 for each air compressor hose 720. The control buttons 550 may be disposed on the attachment end 514 of the housing 510. The control buttons 550 function to turn on and off the respective air compressor hose 720.

The system 500 further comprises a power source (e.g., a battery). As shown in FIG. 8, a battery may be stored in a battery compartment 580 disposed in the housing 510. The motor 620 and compressor 710 and/or other components of the system 500 are operatively connected to a power source (e.g., battery).

In some embodiments, the system 500 comprises an indicator light. The indicator light may be illuminated with the filter 530 is full, for example. In some embodiments, the system 500 comprises a sensor for detecting duct particulars, causing automatic activation of the system 500. In some embodiments, a power switch is used for manual operation of the system 500.

In some embodiments, uses can control the vacuum suction speed. In some embodiments, users can set the system 500 to automatically clean (e.g., with the help of a dust sensor). In some embodiments, users can continually keep the device on or turn it off as they see fit (e.g., via the power button). In some embodiments, the system 500 comprises anti-static grounded bars (e.g., an anti-static cable 750).

The disclosures of the following U.S. Patents are incorporated in their entirety by reference herein: U.S. Pat. No. 4,861,178; U.S. Pat. No. 5,535,477; U.S. Pat. No. 5,559,673; U.S. Pat. No. 6,620,222; U.S. Design Patent No. D600228; U.S. Patent Application No. 2002/0163789; U.S. Patent Application No. 2006/0090289; U.S. Patent Application No. 2007/0089862; U.S. Patent Application No. 2008/0115473.

Various modifications of the invention, in addition to those described herein, will be apparent to those skilled in the art from the foregoing description. Such modifications are also intended to fall within the scope of the appended claims. Each reference cited in the present application is incorporated herein by reference in its entirety.

Although there has been shown and described the preferred embodiment of the present invention, it will be readily apparent to those skilled in the art that modifications may be made thereto which do not exceed the scope of the appended claims. Therefore, the scope of the invention is only to be limited by the following claims.

The reference numbers recited in the below claims are solely for ease of examination of this patent application, and are exemplary, and are not intended in any way to limit the scope of the claims to the particular features having the corresponding reference numbers in the drawings.

What is claimed is:

1. A vacuum system 100 comprising:
    (a) a housing 110 having a hose end 111, a filter end 112, and an attachment end 114, the filter end 112 is at least partially open;
    (b) a vacuum mechanism disposed in an inner cavity 118 of the housing 110, the vacuum mechanism comprises a vacuum fan 210 disposed in an inner channel 210 that extends from the hose end 111 of the housing to near a filter end 112 of the housing 110, the vacuum fan is operatively connected to a motor 220 that functions to control the vacuum fan 210;
    (c) a hose 120 disposed on the hose end 111 of the housing 110, the hose 120 is fluidly connected to the inner channel 230 in the housing 110, wherein an attachment brace 126 is disposed on an outer end 121 of the hose 120, the attachment brace 126 functions to help attach the outer end 121 of the hose 120 to a computer system 101;
    (d) a filter 130 disposed in the filter end 112 of the housing 110;
    (e) an attachment means 190 disposed on the attachment end 114 of the housing 110, the attachment means 190 functions to help temporarily attach the housing 110 to a computer system 101;
    (f) a power button 160 operatively connected to the motor 220, the power button 160 functions to turn the motor 220 on and off; and
    (g) a secondary hose 120*a* extending from the outer end 121 of the hose 120, the secondary hose 120*a* is smaller in diameter than the hose 120.

2. The system 100 of claim 1, wherein the hose 120 is removably attached to a hose aperture 127 disposed in the hose end 111 of the housing 110.

3. The system 100 of claim 1, wherein the filter 130 is removable.

4. The system 100 of claim 1 further comprising a vent 128 disposed in the hose end 111 of the housing 110.

5. The system 100 of claim 1 comprising two secondary hoses 120*a*.

6. The system 100 of claim 1 comprising three secondary hoses 120*a*.

7. The system 100 of claim 1 comprising four secondary hoses 120*a*.

8. The system 100 of claim 1 comprising at least four secondary hoses 120*a*.

9. The system 100 of claim 1, wherein the motor 220 is operatively connected to a power source.

10. The system 100 of claim 9, wherein the power source is stored in a battery compartment 180 disposed in the housing 110.

11. The system 100 of claim 1 further comprising control buttons 150 functioning to control a speed of the motor 220.

12. The system 100 of claim 1, wherein the attachment means 190 is a magnet.

* * * * *